(12) United States Patent
Asadi et al.

(10) Patent No.: US 11,033,862 B2
(45) Date of Patent: Jun. 15, 2021

(54) METHOD OF MANUFACTURING PARTIALLY FREESTANDING TWO-DIMENSIONAL CRYSTAL FILM AND DEVICE COMPRISING SUCH A FILM

(71) Applicant: KONINKLIJKE PHILIPS N.V., Eindhoven (NL)

(72) Inventors: Kamal Asadi, Eindhoven (NL); Johan Hendrik Klootwijk, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 765 days.

(21) Appl. No.: 14/787,778

(22) PCT Filed: Apr. 21, 2014

(86) PCT No.: PCT/EP2014/058034
§ 371 (c)(1),
(2) Date: Oct. 29, 2015

(87) PCT Pub. No.: WO2014/177408
PCT Pub. Date: Nov. 6, 2014

(65) Prior Publication Data
US 2016/0136583 A1    May 19, 2016

(30) Foreign Application Priority Data

May 1, 2013  (EP) .................................... 13166096

(51) Int. Cl.
  *H01L 21/033*    (2006.01)
  *H01L 21/027*    (2006.01)
  (Continued)

(52) U.S. Cl.
  CPC ............. *B01D 69/12* (2013.01); *B01D 67/00* (2013.01); *B01D 67/0039* (2013.01);
  (Continued)

(58) Field of Classification Search
None
See application file for complete search history.

(56) References Cited

U.S. PATENT DOCUMENTS 5,633,209 A * 5/1997 Leedy ................. G03F 7/70658
                                                                216/2
6,555,297 B1 * 4/2003 Lercel ...................... G03F 1/20
                                                                430/296
(Continued)

FOREIGN PATENT DOCUMENTS

EP      2055673 A1      5/2009
EP      2511002 A1     10/2012
(Continued)

OTHER PUBLICATIONS

Meyer et al., "On the Roughness of Singleand Bi-Layer Graphene Membranes", Solid Statecommunications Pergamon, GB, vol. 143, No. 1-2, Jun. 7, 2007 (Jun. 7, 2007), pp. 101-109, XP022130938.
(Continued)

*Primary Examiner* — Stephanie P Duclair

(57) ABSTRACT

Disclosed is a method of manufacturing a partially freestanding two-dimensional crystal film (16, 16'), the method comprising providing a substrate (10) carrying a catalyst layer (14) for forming the two-dimensional crystal layer on a first surface; forming the two-dimensional crystal film on the catalyst layer; covering at least the two-dimensional crystal film with a protective layer (18); etching a cavity (24) in a second surface of the substrate, the second surface being opposite to the first surface, said cavity terminating on the catalyst layer; etching the exposed part of the catalyst layer from the cavity; and removing the protective layer, thereby obtaining a two-dimensional crystal film that is freestanding over said cavity. A device manufactured in this manner is also disclosed.

12 Claims, 2 Drawing Sheets

(51) Int. Cl.
*B81C 1/00* (2006.01)
*B01D 71/02* (2006.01)
*B01D 69/12* (2006.01)
*B01D 67/00* (2006.01)

(52) U.S. Cl.
CPC ..... *B01D 67/0044* (2013.01); *B01D 67/0051* (2013.01); *B01D 67/0062* (2013.01); *B01D 67/0067* (2013.01); *B01D 71/02* (2013.01); *B01D 71/021* (2013.01); *B01D 71/028* (2013.01); *B81C 1/00* (2013.01); *B81C 1/00468* (2013.01); *H01L 21/027* (2013.01); *H01L 21/033* (2013.01)

(56) References Cited

U.S. PATENT DOCUMENTS

| | | | | |
|---|---|---|---|---|
| 6,670,283 | B2* | 12/2003 | Baker | H01L 21/02115 |
| | | | | 257/E21.279 |
| 7,301,360 | B2 | 11/2007 | Kim | |
| 7,982,686 | B2* | 7/2011 | Cahill | H01Q 15/004 |
| | | | | 343/909 |
| 7,988,941 | B2 | 8/2011 | Choi | |
| 8,075,864 | B2 | 12/2011 | Choi | |
| 9,142,635 | B2 | 9/2015 | Heo | |
| 9,482,960 | B2 | 11/2016 | Yakunin | |
| 9,611,140 | B2 | 4/2017 | Russo | |
| 2001/0014438 | A1* | 8/2001 | Tai | B81B 3/0024 |
| | | | | 432/120 |
| 2011/0200787 | A1* | 8/2011 | Regan | H01J 37/20 |
| | | | | 428/138 |
| 2012/0048804 | A1 | 3/2012 | Stetson | |
| 2012/0277360 | A1 | 11/2012 | Scheffer | |
| 2012/0282419 | A1 | 11/2012 | Ahn | |
| 2013/0059155 | A1 | 3/2013 | Choi | |

FOREIGN PATENT DOCUMENTS

| | | |
|---|---|---|
| JP | 2005289706 A | 10/2005 |
| JP | 2011058651 A | 3/2011 |
| JP | 2012088274 A | 5/2012 |
| JP | 2013004718 A | 1/2013 |
| WO | WO9513860 A1 | 5/1995 |
| WO | WO9924141 A1 | 5/1999 |
| WO | WO12001177 A1 | 1/2012 |
| WO | WO1212088274 A1 | 6/2012 |
| WO | WO2012086641 A1 | 6/2012 |
| WO | WO2013046116 A1 | 4/2013 |
| WO | WO2014076613 A1 | 5/2014 |

OTHER PUBLICATIONS

Castro A.H. et al., "New Directions in Science and Technology: Two-Dimensional Crystals", IOP Publishing, Reports on Progress in Physics 74, 082501, pp. 1-9, 2011.
Geim A.K., "Graphene: Status and Prospects", Science, vol. 324, pp. 1530-1534, Jun. 19, 2009 http://science.sciencemag.org/.
Geim A.K. et al., "Exploring Carbon Flatland", 2007 American Institute of Physics, Physics Today, vol. 60, No. 8, pp. 35-41, Aug. 2007, Nature Materials 11, 2 (2012).
Singh V. et al, "Graphene Based Materials,: Past, Present and Future", Progress in Materials Science, vol. 56, pp. 1178-1271, 2011.
Xli X et al., "Transfer of Large-Area Graphene Films for High-Performance Transparent Conductive Electrodes", Nano Letters, vol. 9, No. 12, pp. 4359-4363, 2009.

* cited by examiner

METHOD OF MANUFACTURING PARTIALLY FREESTANDING TWO-DIMENSIONAL CRYSTAL FILM AND DEVICE COMPRISING SUCH A FILM

FIELD OF THE INVENTION

The present invention relates to a method of manufacturing a partially freestanding two-dimensional (2D) crystal film, the method comprising providing a substrate carrying a catalyst layer for forming the two-dimensional crystal film on a first surface and forming the two-dimensional crystal film on the catalyst layer.

The present invention further relates to a device comprising a partially freestanding two-dimensional crystal film.

BACKGROUND OF THE INVENTION 2D crystals such as graphene, boron nitride, tungsten disulphide and molybdenum disulphide crystals are attracting a considerable amount of attention because of the unique properties that such materials potentially exhibit. For instance, such materials theoretically are capable of forming extremely effective gas-tight barrier layers, which may be used in a wide range of applications, such as water purification membranes, DNA sequencing membranes, protection layers of organic light emitting diode (OLED) materials, filters for deep-UV lithography applications, in addition to the application of conductive 2D crystals such as graphene as a conductor in electronic circuits and electro-optical devices.

However, an important obstacle in obtaining 2D crystals that have a high enough quality to exhibit the predicted properties is that in the manufacturing process, the 2D crystal, e.g. graphene, has to be transferred from a first substrate or catalyst foil onto which the 2D crystal has been formed to a second substrate onto which the 2D crystal is to be applied. Such a transfer process may for instance be achieved by forming a photoresist layer, e.g. a PMMA layer, and/or a thermal release tape on the exposed surface of the 2D crystal to support the 2D crystal during the removal of the substrate or foil and subsequent transfer of the released 2D crystal to the target substrate, which photoresist layer and/or a thermal release tape are removed from the 2D crystal following the completion of the transfer process. For instance, a photoresist layer such as PMMA may be removed by a washing step with a suitable solvent, whereas a thermal release tape may be decomposed by heating the tape to above its decomposition temperature. An example of a transfer process is disclosed in US 2012/0282419 A1, which discloses a method of forming a graphene protective film serving as a gas and moisture barrier. The method comprises producing a graphene film on a substrate by supplying heat and a reaction gas containing a carbon source to the substrate; and transferring the graphene film on a flexible substrate by a dry process, a wet process, or a roll-to-roll process to coat the flexible substrate with the graphene film.

There are several problems attached to such transfer processes. Firstly, the subsequent removal of the support material leaves behind debris of the support material, e.g. PMMA debris or tape adhesives debris, on the 2D crystal, which debris negatively affects the electrical properties of a 2D crystal such as graphene. Moreover, the formation of folds, cracks, pinholes and other defects in the 2D crystal during the transfer process is virtually impossible to avoid, which defects degrade the electrical and barrier properties of the 2D crystal.

U.S. Pat. No. 7,988,941 B2 and U.S. Pat. No. 8,075,864 B2 each disclose a freestanding graphene sheet that is substantially defect-free. However, because these graphene sheets need further handling, e.g. placement on a target substrate, defect creation during the further handling is difficult to avoid. Also, it is practically difficult to increase the size of such graphene sheets without introducing defects.

This highlights one of the major bottleneck in the industrialization of graphene, i.e. the availability of an at least partially freestanding graphene layer that can be handled without the risk of introducing pinholes and cracks, wherein the freestanding portion of the graphene layer can have an area ranging from a few $nm^2$ to several hundred $cm^2$ and beyond such that it can be applied for instance as a filter or a membrane.

SUMMARY OF THE INVENTION

The present invention seeks to provide a method of producing a partially freestanding 2-dimensional crystal film that can be handled more easily.

The present invention further seeks to provide a device comprising such a partially freestanding 2-dimensional crystal film.

According to an aspect of the present invention, there is provided a method of manufacturing a partially freestanding two-dimensional crystal film, the method comprising
providing a carrier carrying a catalyst layer for forming the two-dimensional crystal layer on a first surface; forming the two-dimensional crystal film on the catalyst layer;
covering at least the two-dimensional crystal film with a protective layer;
etching a cavity in a second surface of the carrier, the second surface being opposite to the first surface, said cavity terminating on the catalyst layer; etching the exposed part of the catalyst layer from the cavity; and removing the protective layer, thereby obtaining a two-dimensional crystal film that is freestanding over said cavity.

The method of the present invention provides a two-dimensional crystal film such as for example a graphene, boron nitride, tungsten disulphide and molybdenum disulphide and metal dichalcogenide crystal film in which a portion of the two-dimensional crystal film is freestanding but the edges of the film are supported by a support structure formed from the carrier, such that the film can be handled without introducing defects in the film. This approach allows for the formation of large area freestanding two-dimensional crystal films that are substantially defect-free and can be used for instance as filtration or membrane structures without requiring delicate handling as the freestanding portion of the two-dimensional crystal films is supported by said support structure.

In an embodiment, the two-dimensional crystal film is a graphene crystal film. In an embodiment, The two-dimensional crystal film may have a thickness of about 0.3-50 nm, e.g. comprise up to 100 graphene layers, or a thickness of about 20-40 nm, e.g. comprising around 50-100 graphene layers. In an alternative embodiment, the two-dimensional graphene crystal film is a single layer such as a single graphene layer. The thickness of the two-dimensional crystal film can be controlled by the duration of the formation step, as well as by controlling the amount of precursor material used to form the two-dimensional crystal film.

In case of a two-dimensional graphene crystal film, the catalyst layer may be one of a copper, nickel, platinum or ruthenium layer. Copper, nickel, platinum and ruthenium are all known to be suitable graphitization catalysts and are therefore suitable materials for forming the catalyst layer. Copper and nickel are particularly suitable.

Although any suitable carrier may be used, the carrier preferably is a silicon substrate having an oxide surface layer as such substrates can be processed routinely in most semiconductor foundries around the world. In this embodiment, the protective layer may be a nitride layer additionally covering the exposed portions of the oxide surface layer. Nitride dielectric layers, e.g. silicon nitride layers have a good resistance against many etch recipes used in silicon-based semiconductor device manufacturing processes and are therefore particularly suitable as a protective layer over the two-dimensional crystal film.

In an embodiment, the step of etching a cavity in the second surface of the substrate comprises etching the nitride and oxide layers on the second surface to expose the silicon substrate; etching the silicon substrate to expose the oxide layer at the first surface; and etching the oxide layer at the first surface to expose the catalyst layer.

The method may further comprise providing a further oxide layer such as a silicon oxide layer over the protective layer covering the 2-dimensional crystal film, and wherein the step of etching the oxide layer at the first surface to expose the catalyst layer further comprises etching the further oxide layer to expose said protective layer. This is particularly advantageous if the protective layer is a nitride layer, as a nitride layer can comprise pin holes that could give access to the protected two-dimensional crystal film during the various etching steps, thereby risking damage to the two-dimensional crystal film if the film material is not inert to the etch recipe. The further oxide layer effectively seals such pin holes, thereby preventing such damage from occurring.

In accordance with another aspect of the present invention, there is provided a device comprising a carrier; a cavity through the carrier; and a two-dimensional crystal film having a freestanding portion over said cavity, wherein the two-dimensional crystal film is supported by the carrier and separated from said carrier by a catalyst layer for forming the two-dimensional crystal film. Such a device, which may be manufactured by the method of the present invention, benefits from having a freestanding defect-free two-dimensional crystal film over the cavity of through hole through the carrier, which makes the device particularly suited for use as a membrane in a deep UV filter of a wafer stepper or in a DNA sequencing apparatus, a gas barrier protecting an organic light emitting diode in an OLED device, and so on.

The two-dimensional crystal film may be one of a graphene, boron nitride, tungsten disulphide, molybdenum disulphide and metal dichalcogenide crystal film. A graphene crystal film is particularly preferred.

The two-dimensional crystal film may have any suitable thickness, depending on which function it is to perform. The two-dimensional crystal film may have a thickness up to 50 nm, e.g. comprise up to 100 graphene layers, which may be useful if the graphene crystal film is to be used as a barrier layer. The two-dimensional crystal film may have a thickness of less than 20 nm, e.g. comprise less than 50 graphene layers, or even less than 20 layers, and may be a single layer, which may be useful if the two-dimensional crystal film needs to be transparent or is to be used as a membrane.

The carrier preferably is a silicon substrate and the catalyst layer preferably is a graphitizing catalyst such as a copper, nickel, platinum or ruthenium layer.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
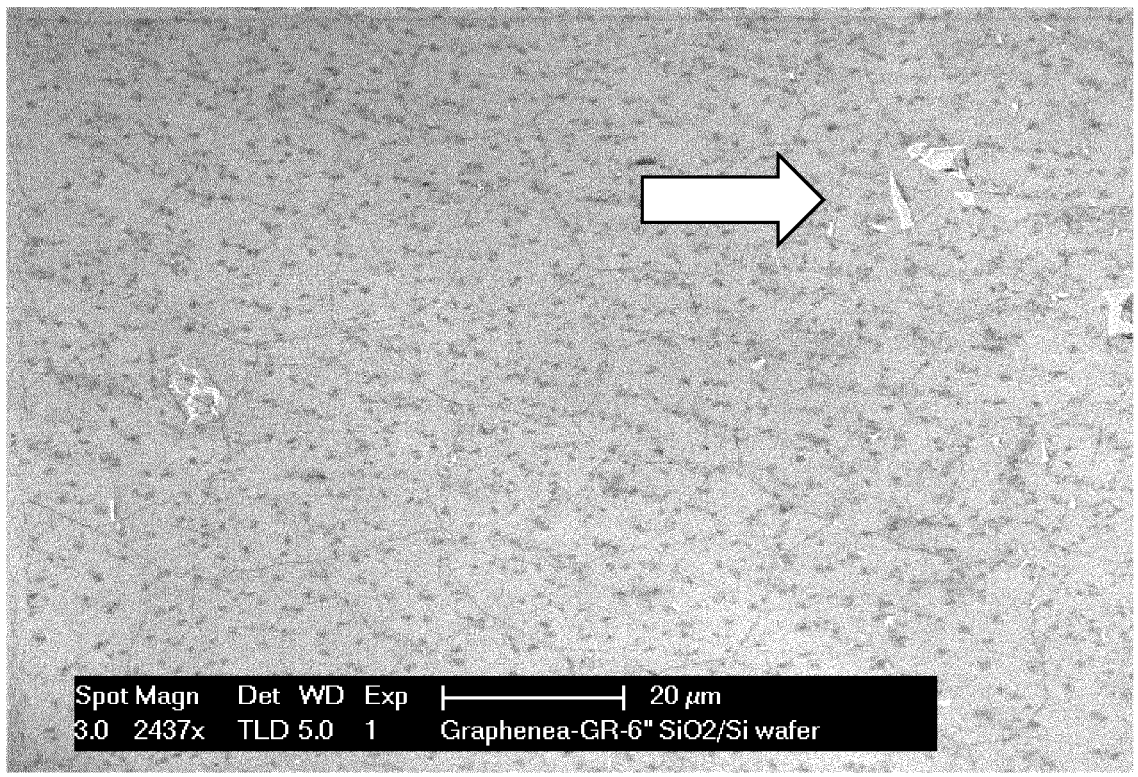
FIG. 1 shows SEM images of a prior art graphene layer after transfer onto a silicon substrate with a PMMA photoresist as a temporary support layer.
Figure 1:
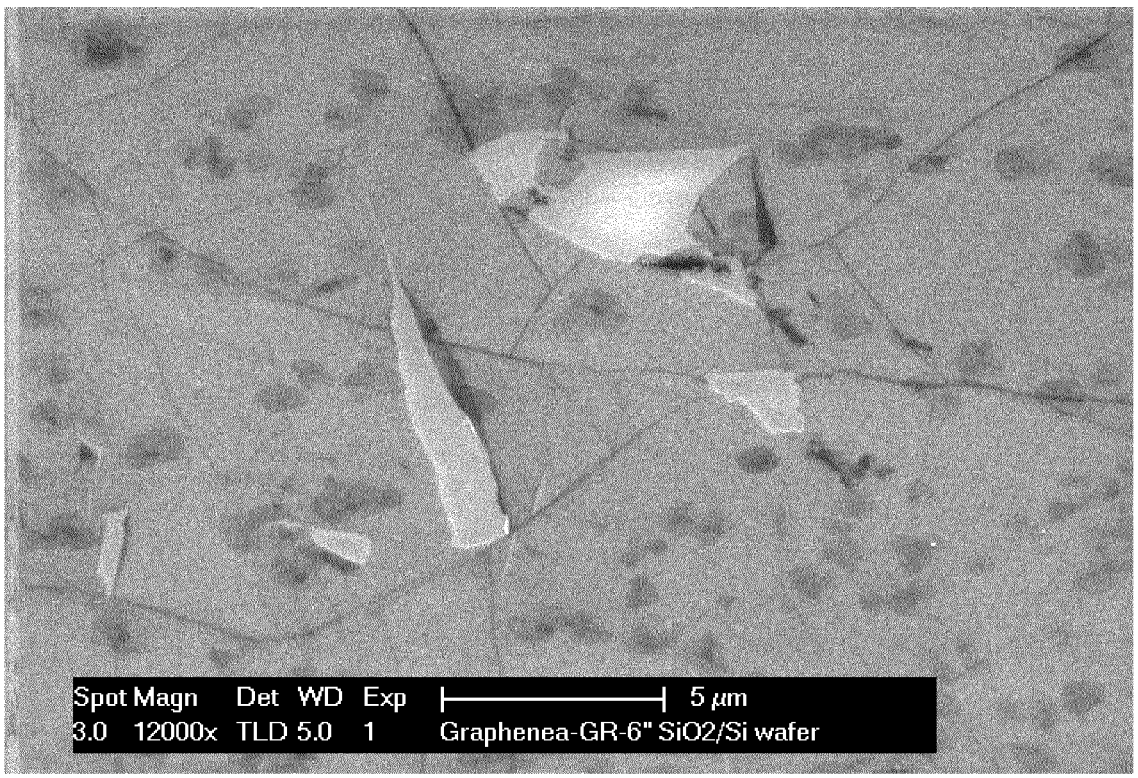

It should be understood that the Figures are merely schematic and are not drawn to scale. It should also be understood that the same reference numerals are used throughout the Figures to indicate the same or similar parts.

FIG. 1 shows a SEM image (top pane) of a silicon substrate onto which a graphene film has been transferred. A region has been identified by the arrow in the top pane and a magnification of the identified region is shown in the bottom pane of FIG. 1. The graphene film during transfer was supported by a PMMA photoresist film, which was removed using suitable solvents following the transfer of the graphene layer onto the silicon substrate. It is clear from the region identified in the SEM images of FIG. 1 that such a transfer process yields a low-grade graphene film that exhibits cracks and is polluted with debris from the PMMA film remaining on the surface of the graphene film.

Embodiments of the present invention seek to provide a two-dimensional crystal film such as a graphene film supported by a substrate that avoid the accumulation of debris on the surface of the two-dimensional crystal film and the formation of defects in such a two-dimensional crystal film that are the consequence of the transfer process of the two-dimensional crystal film onto the substrate.

Embodiments of the present invention seek to provide a device comprising such a two-dimensional crystal film, wherein a portion of the two-dimensional crystal film is suspended over a cavity without being supported by additional films or layers. In the context of the present application, a two-dimensional crystal film having such a suspended portion will be referred to as a partially freestanding two-dimensional crystal film, as the suspended portion is freestanding in the sense that it is not supported by a substrate, a support layer or any other support structure.

Figure 2:
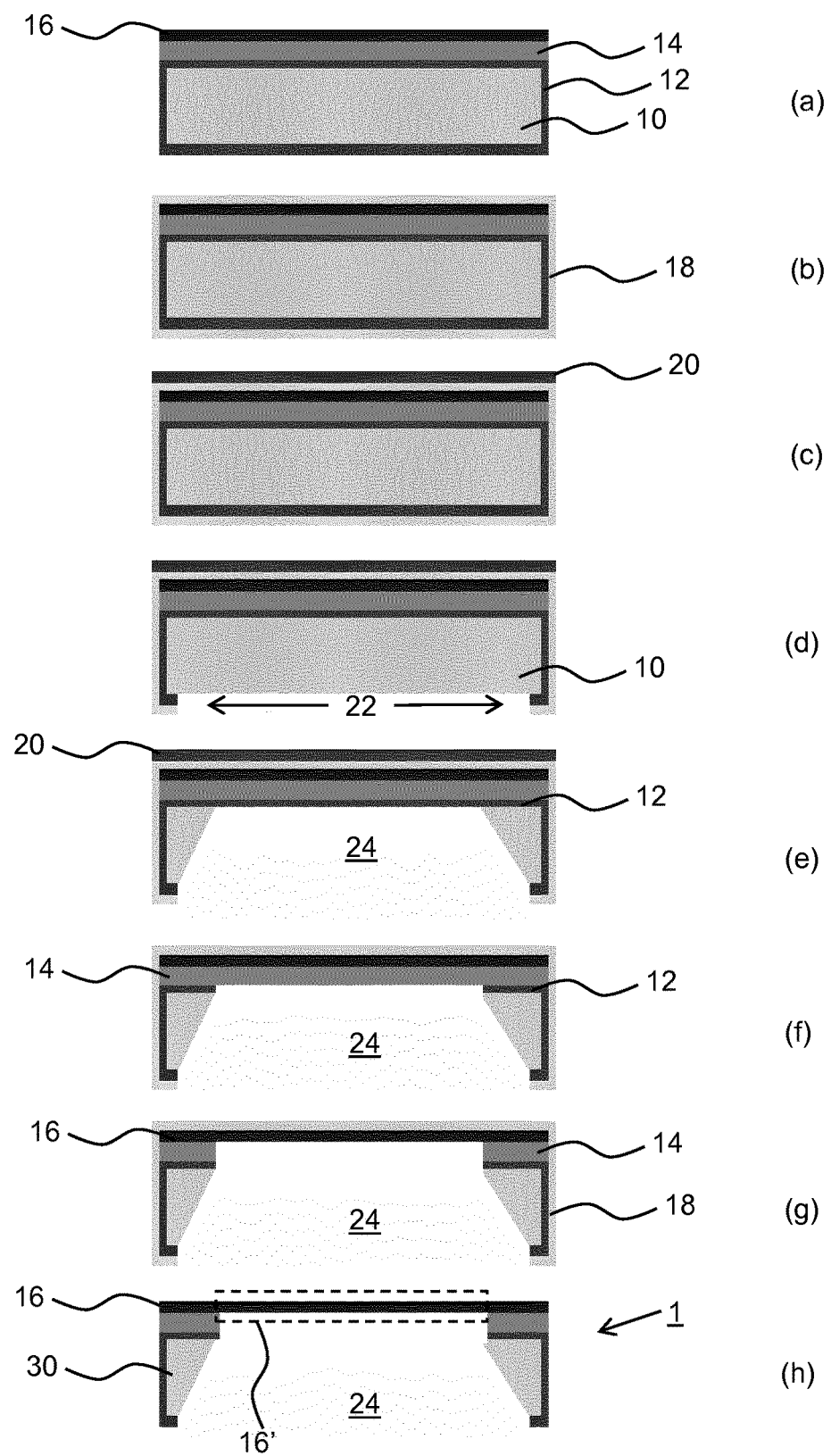
FIG. 2 schematically depicts a manufacturing process of a device according to an embodiment of the present invention.

An example embodiment of a method of manufacturing a partially freestanding two-dimensional crystal film is shown in FIG. 2. The embodiment shown in FIG. 2 will be explained in the context of the formation of a graphene film on a silicon substrate. However, it should be understood that the general concept of the present invention may be applied to any two-dimensional crystal film that can be formed on a catalyst layer on any suitable carrier of a graphitization catalyst layer, e.g. metal carriers such as alumina carriers, polymer carriers, glass carriers and so on. Also, instead of a 2D-crystalline graphene film, a 2D-crystalline boron nitride, tungsten disulphide and molybdenum disulphide film may be formed instead. For the sake of brevity, it is simply noted that many suitable two-dimensional crystal films and substrates will be known to the skilled person, and that any of these suitable two-dimensional crystal films and substrates may be used.

The method schematically depicted in FIG. 2 commences in step (a) with the provision of a silicon substrate 10 covered in an optional silicon oxide layer 12, a graphitization catalyst layer 14 on a first surface and a graphene film 16 formed on the graphitization catalyst layer 14. The silicon substrate 10 may have any suitable shape, e.g. an oblong or round shape, and any suitable dimension. For instance, the silicon substrate 10 may be a 4" wafer, a 6" wafer, an 8" wafer and so on. As silicon has a tendency to slowly oxidize over time, the silicon substrate 10 may be covered in a silicon oxide layer 12, which may have chemical formula $SiO_x$, in which $1<x\leq2$. The silicon oxide layer 12 may be formed through natural oxidation of the silicon substrate 10 or through treatment of the silicon substrate with an oxidizing agent, e.g. a thermal oxidation step using $O_2$ or $H_2O$ as the oxidizing agent. Silicon oxidation is well-known per se and will not be explained in further detail for the sake of brevity.

The graphitization catalyst layer 14 may be formed on the silicon substrate 10 in any suitable manner, e.g. through sputter coating, vapor deposition such as metal organic chemical vapor deposition. It is noted for the avoidance of doubt that where reference is made to the graphitization catalyst layer 14 being formed on the silicon substrate 10, it may be in physical contact with the silicon substrate 10 or with the silicon oxide layer 12.

The graphene film 16 may be formed on the graphitization catalyst layer 14 in any suitable manner. For instance, the graphene film 16 may be formed by heat treating the silicon substrate 10 in the presence of a carbon source such as acetylene gas or another suitable carbon source. The thickness of the graphene film 16 may be controlled by the duration of the heating step, the temperature at which the graphitization takes place and the flow rate of the carbon source over the graphitization catalyst layer 14.

Alternatively, the graphene film 16 may be formed by depositing, e.g. spin-coating, an organic polymer on the graphitization catalyst layer 14 and decomposing the polymer in an inert or reductive atmosphere at elevated temperatures, as for instance is disclosed in U.S. Pat. No. 8,075,864 B2. The thickness of the graphene film 16 formed in this manner may be controlled by controlling the thickness of the polymer layer deposited on the graphitization catalyst. Other methods will be apparent to the skilled person, and any of these methods may be used to form the graphene film 16.

The thickness of the graphene film 16 may be tailored to meet the needs of the device to be formed by embodiments of the method of the present invention by varying the process conditions under which the graphene film is formed, as previously explained. For instance, for a non-transparent graphene film 16, e.g. for use as an optical layer, the graphene film 16 should have a thickness of at least 40 monolayers, and preferably a thickness in the range of 40-100 monolayers, equating to a thickness in the range of 20-50 nm. Alternatively, the graphene film may have a thickness of 1-10 monolayers, i.e. a thickness not exceeding 5 nm, preferably 1-5 monolayers and more preferably a single monolayer having a thickness of about 0.3-0.4 nm.

The method subsequently proceeds to step (b), in which the graphene film 16 is protected by a protective layer 18. In step (b), the whole silicon substrate 10 is enveloped in the protective film 18 by way of non-limiting example. The protective layer 18 may be made of any material that can resist a series of etch recipes required to form a cavity in the silicon substrate 10, as will be explained in more detail later. The protective layer 18 preferably is a material that is readily available in silicon-based semiconductor process technology, such that minimal adjustment of existing processes is required to form this protective layer 18. In an embodiment, the protective layer 18 is a silicon nitride (SiN) layer such as a $Si_3N_4$ layer. It is known per se that silicon nitride is inert to a wide range of etch recipes, most notably a KOH-based recipe, as will be explained in further detail later. The silicon nitride protective layer 18 may be formed in any suitable manner, e.g. by CVD, PE-CVD or the like.

In an optional step (c), a further protective layer 20 may be formed over the portion of the protective layer 18 covering the graphene layer 16. Such a further protective layer 20 may for instance provide additional protection to the graphene layer 16 in case the protective layer 18 contains microscopic defects such as pinholes. In particular, if silicon nitride is used as the protective layer 18, it may be advantageous to apply the further protective layer 20, as it is known per se that CVD-deposited silicon nitride layers can comprise pinhole defects. In an embodiment of the present invention, the protective layer 18 is a silicon nitride layer and the further protective layer 20 is a silicon oxide layer with chemical formula $SiO_x$, in which $1<x\leq2$. Such a silicon oxide layer 20 may be formed on the silicon nitride layer 18 in any suitable manner, e.g. by CVD, PECVD or the like.

At this point it is noted that the thickness of the protective layer 18 and the further protective layer 20 is not particularly critical, as long as the layers are thick enough to provide the necessary protection of the underlying 2-dimensional crystal film 16, e.g. a graphene layer 16. In an embodiment, the protective layer 18 and the further protective layer 20 each have a thickness of at least 5 nm to ensure that the graphene layer 16 is sufficiently protected in subsequent processing steps. The method subsequently proceeds to step (d), in which the back side of the silicon substrate 10 is opened to create an aperture 22. For the avoidance of doubt, the back side of the silicon substrate 10 is a second surface of the silicon substrate 10 that is opposite the first surface on which the graphitization catalyst layer 14 is formed. To this end, the protective layer 18 and the silicon oxide layer 12, if present, are removed by an etching step. For instance, in case of the protective layer 18 being a silicon nitride layer, the protective layer 18 may for instance be removed by a fluorine-based reactive ion etch or any suitable alternative etch recipe, whereas the silicon oxide may be removed by a HF-based etch recipe or any suitable alternative etch recipe. These etch recipes may of course be adjusted in case of protective layers having a different chemical composition. Obviously, these etching steps may be omitted in the absence of the relevant layers on the backside of the silicon substrate 10.

Next, the a cavity 24 is etched in the silicon substrate 10 terminating on the silicon oxide layer 12 on the first surface of the silicon substrate 10 or on the graphitization catalyst layer 14 in the absence of the silicon oxide layer 12. This is shown in step (e). Although any suitable etch recipe may be used, a KOH-based etch recipe is particularly preferred. Due to the typical thickness of the silicon substrate 10, e.g. several hundreds of microns, this etching step may take up to 12 hours to complete. This prolonged exposure to a KOH-based etch recipe can expose the graphene film 16 to this KOH-based recipe if pinholes are present in the protective layer 18, which exposure can damage the graphene film 16. Such exposure and subsequent damage can be prevented by the further protective layer 20 over the protective layer 18, which further protective layer 20 acts as a sealing layer for the protective layer 18 as previously explained.

In step (f), the exposed portions of the silicon oxide layer 12 inside the cavity 24 are removed using any suitable etch recipe, such as a HF-based etch recipe or any suitable alternative etch recipe. In an embodiment, the etch recipe is chosen such that the graphitization catalyst layer 14 is inert to the etch recipe, i.e. the etching step terminates on the graphitization catalyst layer 14. This etch recipe may at the same time be used to remove the further protective layer 20 in case the further protective layer 20 is a silicon oxide layer. Step (f) may be omitted in the absence of both the silicon oxide layer 12 on the first surface of the substrate and an silicon oxide further protective layer 20.

In step (g), the exposed portions of the graphitization catalyst layer 14 are etched away from the cavity 24, terminating on the graphene film 16, after which the protective layer 18 is removed by etching in step (h). For instance, in case of the protective layer 18 being a silicon nitride layer, the protective layer 18 may be removed by a fluorine-based reactive ion etch or any suitable alternative etch recipe. It is noted that step (g) and (h) may be interchanged without departing from the scope of the present invention. In an alternative embodiment, the protective layer 18 may be of the same material as the graphitization catalyst layer 14, e.g. Ni, such that both layers can be simultaneously removed by a single etching step.

The resultant structure is a device 1 in which a two-dimensional crystal film 16, e.g. a graphene film, has a freestanding portion 16' over the cavity 24 formed as a through-hole in the substrate 10, e.g. a silicon substrate. The remainder of the substrate 10 forms a support structure 30 supporting the edge region of the two-dimensional crystal film 16, e.g. a graphene film. The support structure 30 typically comprises a substrate portion 10 and a portion of the graphitization catalyst layer 14 between the substrate portion 10 and the two-dimensional crystal film 16. In case of a silicon substrate 10, a silicon oxide portion 12 may be present in between the silicon substrate 10 and the graphitization catalyst layer 14 as previously explained.

Such a device 1 benefits from a defect-free two-dimensional crystal film 16, such as a graphene film. It is noted that it already has been demonstrated in for instance U.S. Pat. No. 7,988,941 B2 and U.S. Pat. No. 8,075,864 B2 that such defect-free graphene films may be formed on a silicon substrate using various graphene-forming processes as disclosed above. It is further noted that the defect-free nature of the partially released dimensional crystal film 16 according to embodiments of the present invention can be readily verified using Raman spectroscopy, where the absence of a D-band in the Raman spectrum of the graphene is an indication of its defect-free nature, as for instance has been disclosed in U.S. Pat. No. 7,988,941 B2. The device 1 may be used as a gas barrier or a membrane element in any apparatus that benefits from such an element, e.g. a deep UV filter of a wafer stepper or in a DNA sequencing apparatus, an OLED device and so on without the need to transfer the two-dimensional crystal film 16 to a target substrate as the substrate 10 also provides the support structure 30 for the two-dimensional crystal film 16.

Many variations to the embodiment of the method shown in FIG. 2 will be apparent to the skilled person. It should be clear that the present invention is not limited to the example materials mentioned in the detailed description of FIG. 2. Instead, it should be understood that the generic concept of the present invention is to form a two-dimensional crystal film on a catalyst layer on a substrate, wherein the two-dimensional crystal film is protected against exposure to the chemicals used in a series of processing steps to form a cavity in the substrate that ultimately exposes the two-dimensional crystal film. This merely requires the careful selection of suitable materials and suitable etch recipes having the required selectivity to only remove targeted selected materials, which falls within the routine skill set of the person skilled in the art.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a graphene film, the method comprising:
   providing a carrier, the carrier having a first surface and a second surface,
      wherein the first surface is opposite the second surface,
      wherein the carrier is arranged to carry a catalyst layer for forming the graphene film on the first surface forming the graphene film on the catalyst layer;
   covering at least the graphene film with a protective layer;
   etching a cavity in the second surface, the cavity terminating on the catalyst layer;
   etching the exposed part of the catalyst layer from the cavity; and
   removing the protective layer, thereby obtaining a graphene film that is freestanding over the cavity and supported by the carrier in an edge region only and;
   wherein the graphene film is a partially freestanding.

2. The method of claim 1, wherein the graphene film has a thickness in the range of 0.3-50 nm.

3. The method of claim 2, wherein the graphene film has a thickness in the range of 20-40 nm.

4. The method of claim 1, wherein the graphene film is a single layer.

5. The method of claim 1, wherein the catalyst layer is one of a copper, nickel, platinum or ruthenium layer.

6. The method of claim 1,
   wherein the carrier has an oxide surface layer, the oxide surface layer covering all of a side surface of the carrier;
   wherein the protective layer is a nitride layer, the nitride layer at least covering all of the oxide surface layers, wherein the oxide surface layer covers at least the side surface of the carrier.

7. The method of claim 6, the nitride layer further covering the exposed portions of the oxide surface layer on the second surface.

8. The method of claim 6, wherein etching the cavity in the second surface comprises:
   etching the nitride and oxide layers on the second surface to expose the silicon substrate;
   etching the silicon substrate to expose the oxide layer at the first surface; and
   etching the oxide layer at the first surface to expose the catalyst layer.

9. The method of claim 8, further comprising providing a further oxide layer over the protective layer covering the graphene film, and wherein etching the oxide layer at the first surface to expose the catalyst layer further comprises etching the further oxide layer to expose the protective layer.

10. The method of claim 9, wherein the further oxide layer is provided so that the further oxide layer is configured to further protect the graphene film during the etching.

11. The method of claim 9, wherein the further oxide layer is configured to act as a sealing layer for the protective layer during the etching.

12. The method of claim 1, wherein a thickness of the graphene film is controlled by:
   a duration of forming the graphene film on the catalyst layer; and
   an amount of a precursor material that is used to form the graphene film.

* * * * *